United States Patent
Hanaoka et al.

[11] Patent Number: 5,804,839
[45] Date of Patent: Sep. 8, 1998

[54] III-V NITRIDE COMPOUND SEMICONDUCTOR DEVICE AND METHOD FOR FABRICATING THE SAME

[75] Inventors: Daisuke Hanaoka, Nara-ken; Katsuki Furukawa, Osaka, both of Japan

[73] Assignee: Sharp Kabushiki Kaisha, Osaka, Japan

[21] Appl. No.: 772,231

[22] Filed: Dec. 23, 1996

[30] Foreign Application Priority Data

Dec. 28, 1995 [JP] Japan ..................................... 7-344219

[51] Int. Cl.$^6$ .................................................. H01L 33/00
[52] U.S. Cl. .............................................. 257/123; 257/94
[58] Field of Search ........................................ 257/103, 94

[56] References Cited

U.S. PATENT DOCUMENTS

| | | |
|---|---|---|
| 4,139,858 | 2/1979 | Pankove . |
| 5,218,216 | 6/1993 | Manabe et al. . |
| 5,408,120 | 4/1995 | Manabe et al. . |
| 5,657,335 | 8/1997 | Rubin et al. . |

FOREIGN PATENT DOCUMENTS

| | | |
|---|---|---|
| 4-19912 | 4/1992 | Japan . |
| 4-163969 | 6/1992 | Japan . |
| 4-257273 | 9/1992 | Japan . |
| 5-129658 | 5/1993 | Japan . |
| 8-97471 | 4/1996 | Japan . |

OTHER PUBLICATIONS

Nakamura et al., "Candela–class high–brightness InGaN/AlGaN double–heterostructure blue–light–emitting diodes" *Appl. Phys. Lett.* (1994) 64(13):1687–1689.

*Primary Examiner*—Stephen Meier
*Attorney, Agent, or Firm*—Morrison & Foerster LLP

[57] ABSTRACT

A III–V nitride compound semiconductor device of the present invention includes: at least one III–V nitride compound semiconductor layer; and an electrode layer made of non-single crystalline GaN in contact with the III–V nitride compound semiconductor layer.

4 Claims, 5 Drawing Sheets

Formation of p-type electrode layer

Formation of SiO2 mask

Etching

Removing of SiO2 mask

Formation of SiO2 mask

Formation of n-type electrode layer

Removing of SiO2 mask

PRIOR ART

III-V NITRIDE COMPOUND SEMICONDUCTOR DEVICE AND METHOD FOR FABRICATING THE SAME

BACKGROUND OF THE INVENTION

1. Field of the Invention

The present invention relates to a III–V nitride compound semiconductor device, for example, a light-emitting device (such as a light-emitting diode and a laser diode) and a field-effect transistor.

2. Description of the Related Art

Active studies have been made on a semiconductor device formed by using a III–V nitride compound semiconductor. Although an n-type conductive layer can be easily formed by using the III–V nitride compound semiconductor, it was difficult to obtain a p-type conductive layer. Therefore, it was conventionally difficult to put a semiconductor device made of a III–V nitride compound semiconductor into practical use. However, since the p-type layer made of a III–V nitride compound semiconductor has recently been successfully obtained, a light-emitting device utilizing a pn junction has been fabricated.

An electrode utilizing various metal films has been examined as an electrode used in the semiconductor device. For example, in a semiconductor device requiring an Ohmic contact, Al is generally used for an n-type electrode. Materials such as Cr, Ti and In are also used for an n-type electrode. For a p-type electrode, Au is generally used. The use of Ni, Pt and Ag for a p-type electrode is now under examination.

However, in the case where the metal electrodes as described above are used, there arise disadvantages such as a poor adhesion to a III–V nitride compound semiconductor and a low physical strength. As a result, after the metal film is attached onto the III–V nitride compound semiconductor layer by evaporation or the like, problems such as peeling-off of the metal layer during a device fabrication process occur, thereby adversely lowering the reliability of a semiconductor device. For example, in a wire bonding process for connecting a metal wire to a metal electrode so as to output a current from a semiconductor device, peeling-off of the electrode occurs in approximately 3% to 15% of the total number of devices. As a result, such devices are rendered inoperative. This is a main cause for the reduction in fabrication yield.

SUMMARY OF THE INVENTION

A III–V nitride compound semiconductor device of the present invention includes: at least one III–V nitride compound semiconductor layer; and an electrode layer made of non-single crystalline GaN in contact with the III–V nitride compound semiconductor layer.

In one embodiment of the invention, the electrode layer has a hole concentration or an electron concentration of $5 \times 10^{19} cm^{-3}$ or higher.

In another embodiment of the invention, the III–V nitride compound semiconductor layer includes a layered structure including two or more layers each containing at least Ga as a Group III element and N as a Group V element.

In still another embodiment of the invention, the electrode layer has a transmittance of 80% or more with respect to a wavelength region of light emitted from the layered structure.

According to another aspect of the present invention, a method for fabricating a III–V nitride compound semiconductor device includes the steps of: forming a III–V nitride compound semiconductor layer; and forming an electrode layer made of non-single crystalline GaN on the III–V nitride compound semiconductor layer.

In one embodiment of the invention, the step of forming the electrode layer includes growing a GaN layer at a substrate temperature in the range of about 350° C. to 600° C. through metalorganic chemical vapor deposition.

In another embodiment of the invention, the step of forming the electrode layer includes growing a GaN layer at a substrate temperature in the range of about 150° C. to 450° C. through metalorganic chemical vapor deposition utilizing electron cyclotron resonance plasma.

Thus, the invention described herein makes possible the advantages of: (1) providing a III–V nitride compound semiconductor device including an electrode layer with an excellent adherence to a III–V nitride compound semiconductor layer and a high physical strength, capable of improving a yield; and (2) providing a method for fabricating the same.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples.

The non-single crystalline GaN herein includes polycrystalline GaN, amorphous GaN and microcrystalline GaN excluding single crystalline GaN. In examples described below, the present invention will be described using polycrystalline GaN as an example of non-single crystalline GaN. However, the present invention is not limited to polycrystalline GaN. The same effect can be obtained with amorphous GaN and non-single crystalline GaN.

EXAMPLE 1

In Example 1, a light-emitting device is fabricated as a III–V nitride compound semiconductor device. In this light-emitting device, a polycrystalline GaN layer is used as an electrode layer formed so as to be in contact with a III–V nitride compound semiconductor layer.

Figure 1:
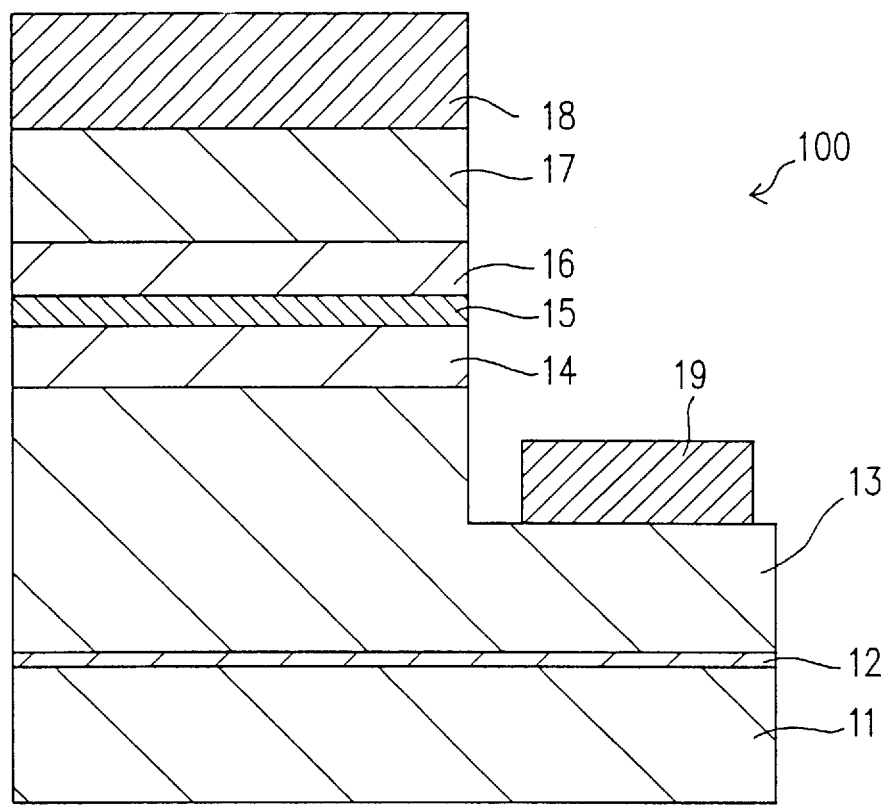
FIG. 1 is a cross-sectional view showing a layered structure of a III–V nitride compound semiconductor device in Example 1 according to the present invention.

FIG. 1 is a cross-sectional view showing a layered structure of a III–V nitride compound semiconductor device 100 in Example 1 of the present invention.

First, the structure of the III–V nitride compound semiconductor device 100 will be described with reference to FIG. 1.

In FIG. 1, a GaN buffer layer 12 having a thickness of 20 nm is provided on a C face of a sapphire is substrate 11. On the GaN buffer layer 12, an n-type GaN layer 13 having a thickness of 3000 nm (3 μm), an n-type $Al_{0.15}Ga_{0.85}N$ layer 14 having a thickness of 150 nm, an $In_{0.6}Ga_{0.94}N$:Zn layer 15 having a thickness of 50 nm, a p-type $Al_{0.15}Ga_{0.85}N$ layer 16 having a thickness of 150 nm and a p-type GaN layer 17 having a thickness of 300 nm are deposited in this order. A p-type GaN electrode layer 18 having a thickness of 300 nm, serving as an electrode for the p-type layer 17, is provided on the layer 17. Part of the thus obtained layered structure is removed from the top of the p-type GaN electrode layer 18 to the middle of the n-type GaN layer 13 by etching so as to partially expose the n-type GaN layer 13. On the exposed part of the n-type GaN layer 13, an n-type GaN electrode layer 19 having a thickness of 200 nm is provided as an electrode for the n-type layer 13. In this manner, the light-emitting diode is constituted as the III–V nitride compound semiconductor device 100 of Example 1.

The light-emitting diode is fabricated as follows.

First, the GaN buffer layer 12 is grown to a thickness of 20 nm on the C face of the sapphire substrate 11 at a substrate temperature of 600° C. by using a metalorganic chemical vapor deposition (MOCVD) apparatus. On the GaN buffer layer 12, the n-type GaN layer 13 with an electron concentration of $2 \times 10^{18}$ $cm^{-3}$, which is doped with Si serving as an impurity, is grown to a thickness of 3000 nm (3 μm) at a substrate temperature of 1050° C. Subsequently, the n-type $Al_{0.15}Ga_{0.85}N$ layer 14 with an electron concentration of $2 \times 10^{16}$ $cm^{-3}$, which is doped with Si serving as an impurity, is grown on the n-type GaN layer 13 to a thickness of 150 nm. Then, the $In_{0.06}Ga_{0.94}N$:Zn layer 15, which is doped with Zn serving as an impurity, is grown to a thickness of 50 nm on the n-type $Al_{0.15}Ga_{0.85}N$ layer 14 at a substrate temperature of 800° C. The $In_{0.06}Ga_{0.94}N$:Zn layer 15 serves as an active light-emitting layer of the light-emitting diode. Zn, serving as a dopant, forms a deep acceptor level which functions as the luminescence center. The active light-emitting layer emits light having a wavelength of about 450 nm at room temperature. On the $In_{0.06}Ga_{0.94}N$:Zn layer 15, the p-type $Al_{0.15}Ga_{0.85}N$ layer 16 with a hole concentration of $1 \times 10^{18}$ $cm^{-3}$, which is doped with Mg serving as an impurity, is grown to a thickness of 150 nm at a substrate temperature of 1050° C. Subsequently, the p-type GaN layer 17 with a hole concentration of $1 \times 10^{18}$ $cm^{-3}$, which is doped with Mg serving as an impurity, is grown to a thickness of 300 nm. In this manner, a layered structure having a doublehetero (DH) structure made of III–V nitride compound semiconductors is obtained.

Next, a p-type GaN layer serving as the electrode 18 for p-type layer (hereinafter, referred to simply as p-type electrode layer) is grown on the p-type GaN layer 17 by using a MOCVD apparatus. A growth process of the p-type GaN layer has a distinctive feature in that the layer is grown at a low substrate temperature. For example, in the case where a MOCVD method is employed, the GaN layer constituting the DH structure of the light-emitting diode is normally grown at a substrate temperature of about 1050° C. In the present invention, however, the GaN layer serving as an electrode layer is grown at a low substrate temperature, i.e., at between about 350° C. and 600° C. In Example 1, the Mg-doped p-type GaN layer having a hole concentration of $1 \times 10^{20}$ $cm^{-3}$ and a resistivity of $8 \times 10^{-3}$ Ωcm is grown to a thickness of 300 nm at a substrate temperature of 500° C.

The thus obtained p-type GaN layer has a crystallinity which is estimated through Reflection High Energy Electron Diffraction (RHEED). As a result, it is found that the p-type GaN layer has a polycrystalline structure. The p-type GaN itself exhibits a transmittance of 80% or higher with respect to light having a wavelength in the range of about 400 nm to 500 nm.

Thereafter, as described in detail below, the fabrication steps shown in FIGS. 2A to 2G are performed so as to form an n-type GaN layer serving as the electrode 19 for n-type layer (hereinafter, referred to as the n-type electrode layer 19). In FIGS. 2A to 2G, the buffer layers 12 through the p-type GaN layer 17 are collectively referred to as a semiconductor layered structure 20. The semiconductor layered structure 20 is a III–V nitride compound semiconductor layered structure having a DH structure including a pn junction.

Figure 2A:
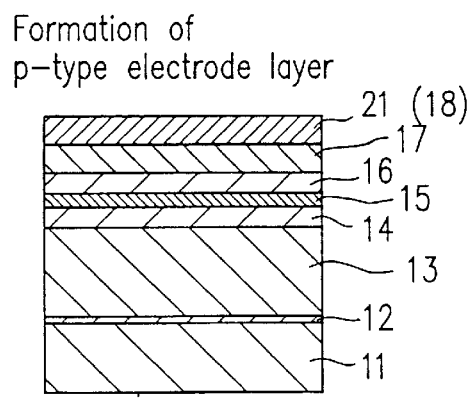
FIGS. 2A to 2G are cross-sectional views, each showing a fabrication step of the III–V nitride compound semiconductor device shown in FIG. 1.
Figure 2B:
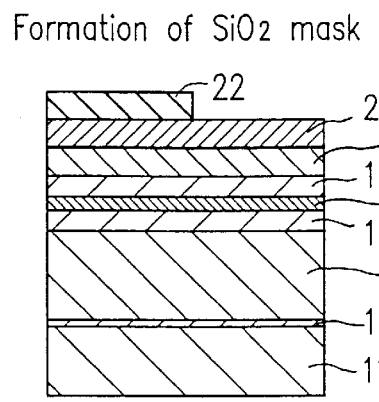
Figure 2C:
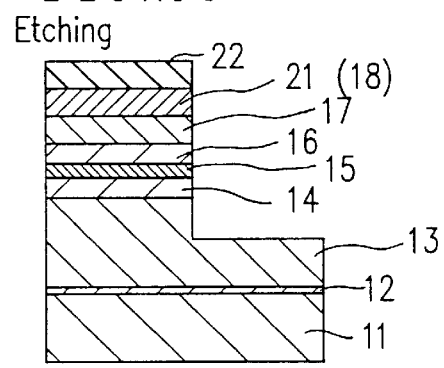
Figure 2D:
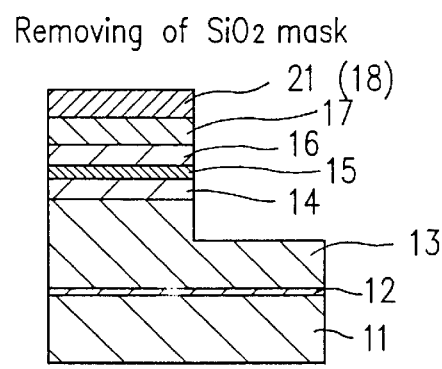
Figure 2E:
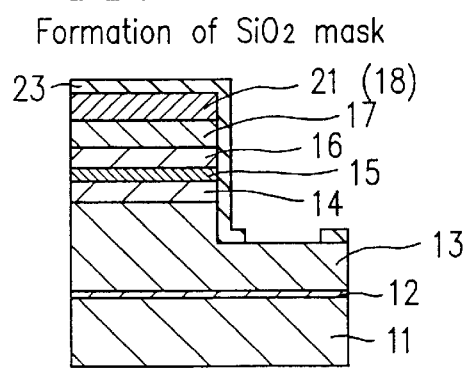
Figure 2F:
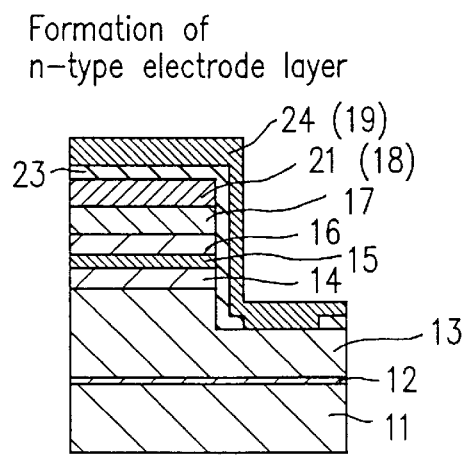
Figure 2G:
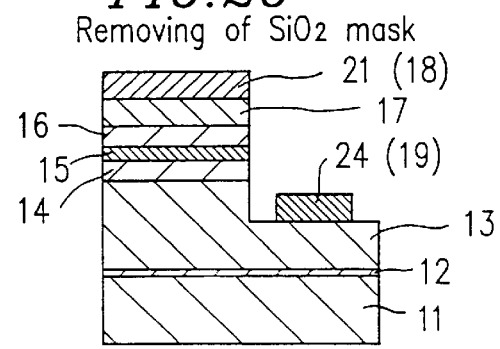

First, as shown in FIG. 2A, the semiconductor layered structure 20 and a p-type GaN layer 21 to be the p-type electrode layer 18 are successively formed on the substrate 11, thereby fabricating a substrate part 101. Then, as shown in FIG. 2B, an $SiO_2$ layer 22 is formed on the p-type GaN layer 21 of the substrate part 101 so as to have a predetermined pattern. Next, as shown in FIG. 2C, part of the semiconductor layered structure 20 and the p-type GaN layer 21 is removed by etching using the $SiO_2$ layer 22 as a mask so as to expose part of the n-type GaN layer 13 (which constitutes a portion of the layered structure 20). Subsequently, the $SiO_2$ layer 22 is removed as shown in FIG. 2D. Next, another $SiO_2$ layer 23, serving as a mask for forming a n-type electrode layer, is formed so as to have a predetermined pattern as shown in FIG. 2E. Thereafter, the thus obtained layered structure is introduced into an MOCVD apparatus so as to grow the n-type GaN layer 24 to be the n-type electrode layer 19 on the $SiO_2$ layer 23 as shown in FIG. 2F. This growth process of the n-type GaN layer 24 has a distinct feature in that the n-type GaN layer 24 is grown at a low substrate temperature as in the case of the p-type GaN layer 21 serving as the p-type electrode layer 18. For example, in the case where MOCVD method is employed, a growth process is conducted at a substrate temperature between about 350° C. and 600° C. In Example 1, the Si-doped n-type GaN layer 24 having an electron concentration of $2 \times 10^{21}$ $cm^{-3}$ and a resistivity of $2 \times 10^{-4}$ Ωcm is grown to a thickness of 200 nm at a substrate temperature of 500° C. The thus obtained n-type GaN layer 24 has a crystallinity which is estimated through RHEED. As a result, it is found that the n-type GaN layer 24 has a polycrystalline structure. Moreover, the n-type GaN layer 24 itself exhibits a transmittance of 85% or more with respect to light having a wavelength in the range of 400 nm to 500 nm. Then, by removing the $SiO_2$ layer 23 as shown in FIG. 2G, the p-type electrode layer 18 and the n-type electrode layer 19 are obtained.

The thus obtained wafer is cut into a chip by dicing, thereby completing the light-emitting diode 100 shown in FIG. 1 as the light-emitting device of Example 1.

The resultant chip is mounted onto a stem. The electrodes are led to the stem from the p-type electrode layer 18 and the n-type electrode layer 19 by wire bonding. Then, the characteristics thereof are estimated.

As a result, blue light emission with an operational voltage of 3.4 V at a current flow of 20 mA, a wavelength of 450 nm and a luminous intensity of 1000 mcd as typical characteristics is obtained. A defective device due to peeling-off of the electrode after mounting onto the stem or the like is scarcely found in the resultant devices. As a result, a yield of approximately 100% is obtained.

A comparative example will be described below for comparison with the Example 1 described above.

Figure 3:
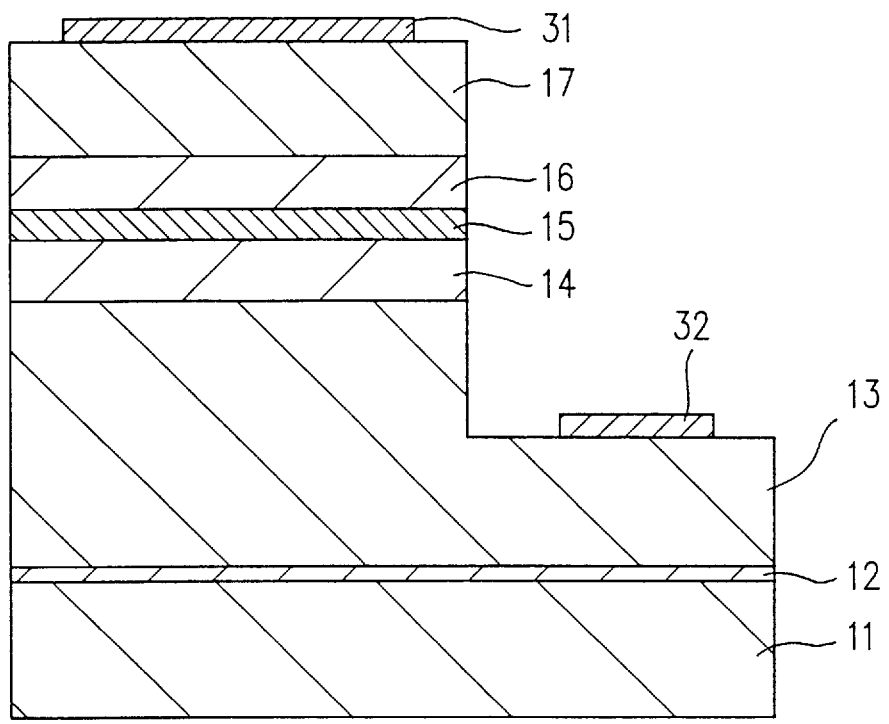
FIG. 3 is a cross-sectional view showing a layered structure of a III–V nitride compound semiconductor device in a comparative example.

In this comparative example, a light-emitting diode is fabricated as a light-emitting device having metal electrodes 31 and 32 as shown in FIG. 3. The same parts as those in Example 1 are denoted by the same reference numerals.

First, a layered structure having a DH structure made of III–V nitride compound semiconductors is fabricated on the C face of the sapphire substrate 11 as in Example 1 described above.

Subsequently, as in Example 1, an SiO$_2$ layer is formed on the p-type GaN layer 17 so as to have a predetermined pattern. Part of the thus obtained layered structure from the top of the p-type GaN layer 17 to the middle of the n-type GaN layer 13 is removed by etching using the patterned SiO$_2$ layer as a mask so as to partially expose the n-type GaN layer 13. Thereafter, the SiO$_2$ layer is removed. Then, a photoresist serving as a mask for forming an n-type electrode layer is applied onto the surface of the n-type GaN layer 13 so as to have a predetermined pattern. After an Al layer serving as the metal electrode layer 32 for n-type layer (hereinafter, referred to as the n-type metal electrode layer 32) is formed by evaporation, the photoresist is removed. In a similar manner, a photoresist serving as a mask for forming a p-type electrode layer is applied onto the surface of the p-type GaN layer 17 so as to have a predetermined pattern. After the Au layer serving as the p-type metal electrode layer 31 is formed by evaporation, the photoresist is removed. By the above process, the p-type metal electrode layer 31 and the n-type metal electrode layer 32 are obtained.

The thus obtained wafer is cut into a chip by dicing, thereby completing a light-emitting diode as shown in FIG. 3.

The resultant chip is mounted onto a stem. The electrodes are led to the stem from the p-type metal electrode layer 31 and the n-type metal electrode layer 32 by wire bonding. Then, the characteristics thereof are estimated.

As a result, blue light emission with an operational voltage of 3.8 V at a current flow of 20 mA, a wavelength of 450 nm and a luminous intensity of 500 mcd as typical characteristics is obtained. About 10% of the total devices are defective devices which are rendered inoperative due to peeling-off of the electrodes after mounting onto the stem or the like.

Therefore, the experimental results of Example 1 and the comparative example show the following. In the light-emitting diode of Example 1 using polycrystalline GaN electrode layers as the p-type electrode layer 18 layer and the n-type electrode layer 19, the yield and the reliability of the semiconductor device can be remarkably improved as compared with the light-emitting diode of the comparative example using the metal layers, i.e., Au layer and Al layer, as the electrodes. It is considered that a yield and reliability are improved because the polycrystalline GaN electrode layer has a good adherence to the III–V nitride compound semiconductor layer and a high physical strength as compared with the metal electrode. Moreover, in Example 1 using the polycrystalline GaN electrode layer, an operational voltage can be lowered as compared with the comparative example using the metal electrode. It is considered that a low operational voltage is obtained owing to a good Ohmic contact of the polycrystalline GaN electrode layer with the III–V nitride compound semiconductor layer as compared with the metal electrode.

Furthermore, in Example 1 using the polycrystalline GaN electrode layer, a high luminous intensity is obtained as compared with the comparative example using the metal electrode. The reason for this is considered as follows. In the case where the polycrystalline GaN electrode layer is used, since light emitted from the light-emitting layer immediately below the upper electrode passes through the polycrystalline GaN electrode, light is externally output from the upper part. On the other hand, since light is reflected by the metal electrode in the case where the metal electrodes are used, a light output efficiency from the upper part is low. Furthermore, since the polycrystalline GaN electrode can be fabricated by the same film growth apparatus as that used for forming the III–V nitride compound semiconductor layer constituting the device structure, the fabrication process can be advantageously simplified.

EXAMPLE 2

In Example 2, a light-emitting device having a structure different from that of the light-emitting device of Example 1 is fabricated as a III–V nitride compound semiconductor device. In the light-emitting device of Example 2, the polycrystalline GaN layer is used as an electrode layer formed so as to be in contact with the III–V nitride compound semiconductor layer.

Figure 4:
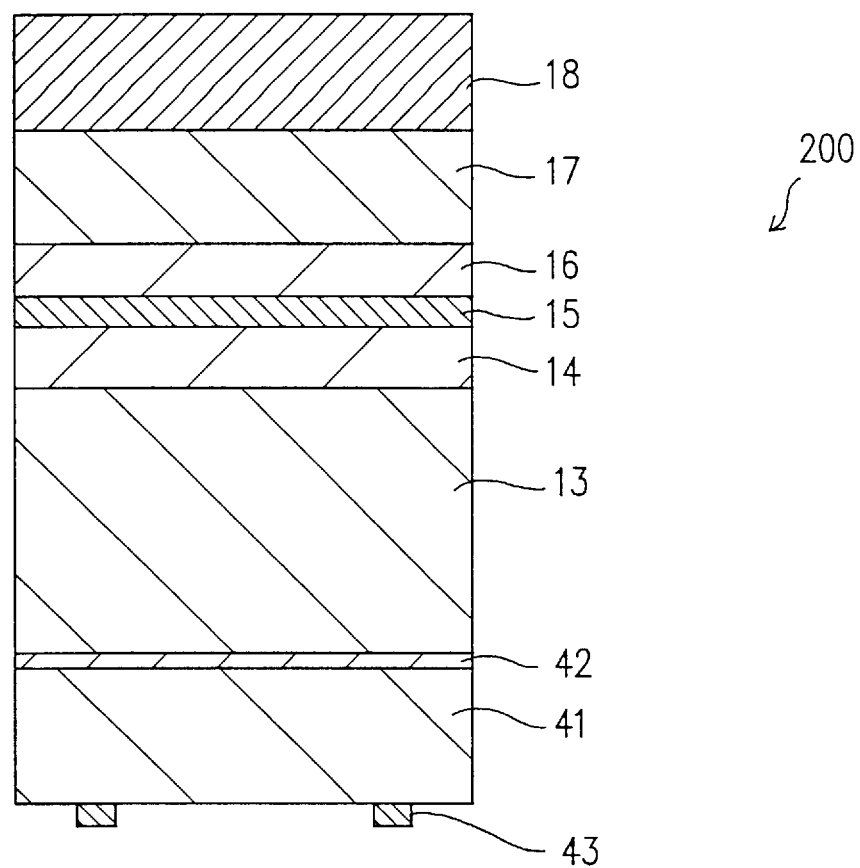
FIG. 4 is a cross-sectional view showing a layered structure of a III–V nitride compound semiconductor device in Example 2 according to the present invention.

FIG. 4 is a cross-sectional view showing a layered structure of a III–V nitride compound semiconductor device 200 in Example 2 of the present invention. The same parts as those in FIG. 1 are denoted by the same reference numerals.

In FIG. 4, an AlN buffer layer 42 having a thickness of 30 nm is provided on an n-type 6H-SiC substrate 41 with a (0001) Si face. On the AlN buffer layer 42, the n-type GaN layer 13, the n-type Al$_{0.15}$Ga$_{0.85}$N layer 14, the In$_{0.06}$Ga$_{0.94}$N:Zn layer 15, the p-type Al$_{0.15}$Ga$_{0.85}$N layer 16, and the p-type GaN layer 17 are deposited in this order as in Example 1. On the p-type GaN layer 17, a p-type GaN electrode layer serving as the p-type electrode layer 18 is provided. On part of the bottom face of the n-type 6H-SiC substrate 41, a Ni electrode layer 43 serving as an electrode for the n-type layer (hereinafter, referred to as the n-type electrode layer 43) is provided. The light-emitting diode as the Ill–V nitride compound semiconductor device of Example 2 has the structure as described above.

The light-emitting diode having the above structure is fabricated as follows.

The n-type 6H-SiC substrate 41 is introduced into an MOCVD apparatus. The AiN buffer layer 42 is grown to a thickness of 30 nm at a substrate temperature of 1050° C. On the AlN buffer layer 42, the n-type GaN layer 13, the n-type Al$_{0.15}$Ga$_{0.85}$N layer 14, the In$_{0.06}$Ga$_{0.94}$N:Zn layer 15, the p-type Al$_{0.15}$Ga$_{0.85}$N layer 16, and the p-type GaN layer 17 are successively grown in the same manner as in Example 1. In this manner, a layered structure having a DH structure made of III–V nitride compound semiconductors is fabricated.

Next, the p-type GaN layer serving as the p-type electrode layer 18 is grown on the p-type GaN layer 17 by using a molecular beam epitaxy (MBE) apparatus. The MBE apparatus uses a nitrogen source material obtained by exciting an N$_2$ gas through a radio frequency plasma. A growth process of the p-type GaN layer has a distinct feature in that the layer is grown at a low substrate temperature as in Example 1. For example, in the case where an MBE method is employed, the GaN layer constituting the DH structure of the light-emitting diode is normally grown at a substrate temperature between 600° C. and 800° C. in order to obtain a high quality GaN layer. In Example 2 of the present invention, the GaN layer serving as the electrode layer is grown at a low substrate temperature, i.e., between about 150° C. and 400° C. As a result of the growth process at a low temperature, single crystallinity is lowered, thereby obtaining a polycrystalline structure. In Example 2, the Mg-doped p-type GaN layer having a hole concentration of $3 \times 10^{-20}$ $\Omega cm^{31}$ $^3$ and a resistivity of $5 \times 10^{-3}$ $\Omega cm$ is grown to a thickness of 300 nm at a substrate temperature of 350° C. The thus obtained p-type GaN layer has a crystallinity which is estimated through RHEED. As a result, it is found that the p-type GaN layer has a polycrystalline structure. The p-type GaN layer 18 itself exhibits a transmittance of 80% or more with respect to light having a wavelength in the range of about 400 nm to 500 nm.

Thereafter, on part of the bottom face of the n-type 6H-SiC substrate 41, the Ni electrode layer 43 is formed as an n-type electrode layer by evaporation.

The resultant wafer is cut into a chip by dicing, thereby obtaining a light-emitting diode as shown in FIG. 4.

The chip is mounted onto a stem. The electrodes are led to the stem from the n-type electrode layer 43 directly and from the p-type electrode layer 18 by wire bonding. The characteristics of the light-emitting diode are estimated.

As a result, blue light emission with an operational voltage of 3.3 V at a current flow of 20 mA, a wavelength of 450 nm and a luminous intensity of 900 mcd as typical characteristics is obtained. A defective device due to peeling-off of the electrode after mounting on the stems or the like is scarcely found. As a result, a yield of approximately 100% is obtained.

EXAMPLE 3

In Example 3, a light-emitting device having a reverse layered structure to that of the light-emitting device of Example 2 is fabricated as a III–V nitride compound semiconductor device. A polycrystalline GaN layer is used as an electrode layer formed so as to be in contact with the III–V nitride compound semiconductor layer.

Figure 5:
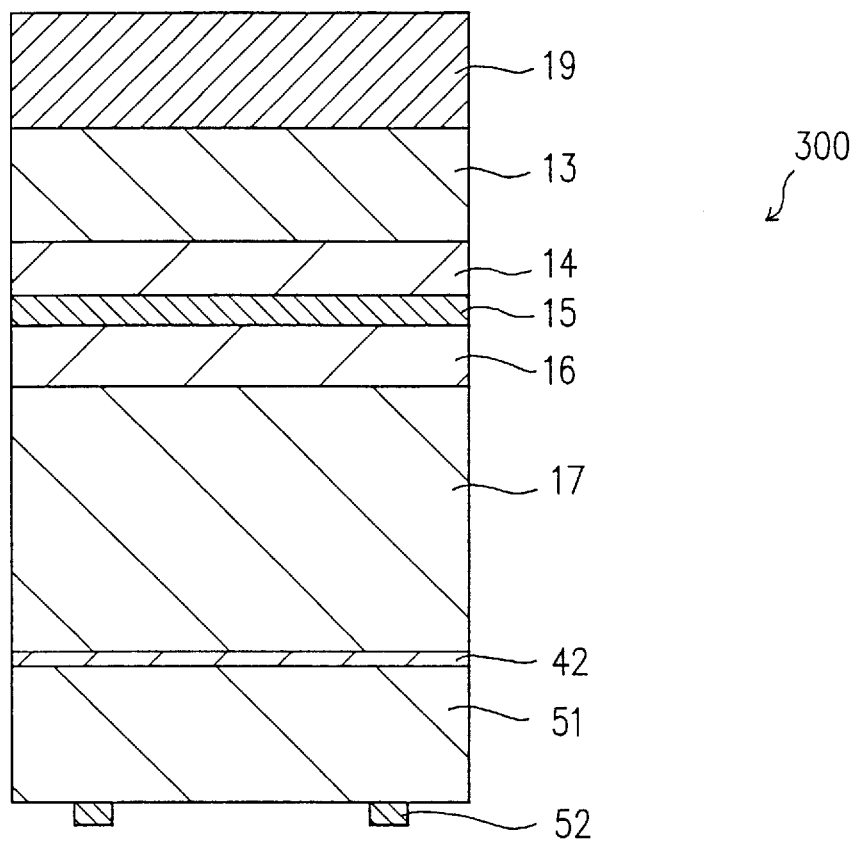
FIG. 5 is a cross-sectional view showing a layered structure of a III–V nitride compound semiconductor device in Example 3 according to the present invention.

FIG. 5 is a cross-sectional view showing a layered structure of a III–V nitride compound semiconductor device 300 in Example 3 of the present invention.

In FIG. 5, the same AlN buffer layer 42 as that of Example 2 is provided on a p-type 6H-SiC substrate 51 with a (0001) Si face. On the AlN buffer layer 42, the same III–V nitride compound semiconductor layers as those in Example 2 are successively deposited in a reverse order, that is, in the order of the p-type GaN layer 17, the p-type $Al_{0.15}Ga_{0.85}N$ layer 16, the $In_{0.06}Ga_{0.94}N$:Zn layer 15, the n-type $Al_{0.15}Ga_{0.85}N$ layer 14 and the n-type GaN layer 13. On the n-type GaN layer 13, an n-type GaN electrode layer having a thickness of 300 nm is provided as the n-type electrode layer 19. On part of the bottom of the p-type 6H-SiC substrate 51, a Ti/Al electrode layer 52 is provided as an electrode layer for the p-type layer (hereinafter, referred to as the p-type electrode layer 52). The light-emitting diode 300 as a III–V nitride compound semiconductor device of Example 3 has the structure as described above.

The light-emitting diode 300 is fabricated as follows.

First, the p-type 6H-SiC substrate 51 is introduced into an MOCVD apparatus so as to grow the AlN buffer layer 42 in the same manner as in Example 2. Then, the p-type GaN layer 17, the p-type $Al_{0.15}Ga_{0.85}N$ layer 16, the $In_{0.06}Ga_{0.94}N$:Zn layer 15, the n-type $Al_{0.15}Ga_{0.85}N$ layer 14 and the n-type GaN layer 13 are successively grown on the AlN buffer layer 42, that is, in the reverse order of Example 2, thereby fabricating a layered structure having a DH structure made of III–V nitride compound semiconductors.

Next, an n-type GaN layer to be the n-type electrode layer 19 is grown on the n-type GaN layer 13 by using an electron cyclotron resonance (ECR)-MOCVD apparatus. The ECR-MOCVD apparatus uses active nitrogen obtained by performing an ECR microwave plasma excitation for an $N_2$ gas as a nitrogen source material. A growth process of the n-type GaN layer has a distinct feature in that the layer is grown at a low substrate temperature as in Example 1 described above. For example, in the case where the ECR-MOCVD method is employed, a GaN layer serving as an electrode layer is grown at a low substrate temperature, i.e., between 150° C. and 450° C. In Example 3, an n-type GaN layer having an electron concentration of $1 \times 10^{21}$ $cm^{-3}$ and a resistivity of $4 \times 10^{-4}$ $\Omega cm$, which is doped with oxygen as an impurity, is grown to a thickness of 300 nm at a substrate temperature of 370° C. The thus obtained n-type GaN layer has a crystallinity which is estimated through RHEED. As a result, it is found that the n-type GaN layer has a polycrystalline structure. The n-type GaN itself exhibits a transmittance of 80% or higher with respect to light having a wavelength in the range of about 400 nm to 500 nm.

Thereafter, on a part of the bottom face of the p-type 6H-SiC substrate 51, the Ti/Al electrode layer 52 is formed as an electrode layer for the p-type layer by evaporation.

The thus obtained wafer is out into a chip by dicing, thereby completing the light-emitting diode as shown in FIG. 5.

The chip is mounted onto a stem. The electrodes are led to the stem from the p-type electrode layer 52 directly and from the n-type electrode layer 19 by wire bonding, and the characteristics of the light-emitting diode are estimated. In Example 3, Al is deposited as a pad on a region where wire bonding is performed so as to lessen the impact of wire bonding. In this case, Al does not affect the characteristics of the electrode.

As a result, blue light emission with an operational voltage of 3.4 V at a current flow of 20 mA, a light-emitting wavelength of 450 nm and a luminous intensity of 800 mcd as typical characteristics is obtained. A defective device due to peeling-off of the electrode after mounting on the stems or the like is scarcely found. As a result, a yield of approximately 100% is obtained.

Thus, in the III–V nitride compound semiconductor devices of Examples 1 to 3 according to the present invention, a polycrystalline GaN layer is used as an electrode layer formed so as to be in contact with the III–V nitride compound semiconductor layer.

As described above, in the case where the non-single crystalline GaN electrode layer is used, a good adherence to the III–V nitride compound semiconductor layer and a high physical strength are obtained as compared with the conventional case where a metal electrode layer is used. Therefore, a fabrication yield of the semiconductor device is improved as well as the reliability of the semiconductor device. Moreover, since the non-single crystalline GaN electrode layer has a high transparency, a transmittance with respect to light emitted from the layered structure can be increased. Light, which is not conventionally externally output due to reflection by a metal electrode, is externally available. A transmittance with respect to light emitted from the layered structure is preferably at least 70% or more, and more preferably 80%. In such a case, a transmittance can be increased to 80% or more with respect to emitted light having a wavelength in the range of about 400 nm to 500 nm by adjusting a thickness of the electrode layer or selecting an impurity contained in the electrode layer. As a result, such a light-emitting device is rendered applicable as a blue-light emitting device.

The reason that the non-single crystalline GaN layer is employed in the present invention is as follows. Owing to the recent progress in crystal growth techniques, a GaN layer with excellent crystallinity can be obtained. Moreover, improvement in a doping technique enables a conductivity control of the n-type and p-type layers. However, since a single crystalline GaN layer has a relatively high resistivity, a current is not sufficiently diffused in the semiconductor layer in the case where the single crystalline GaN layer is used as an electrode layer. In order to lower the resistivity of the electrode layer, it may be possible to dope the single crystalline GaN layer with an impurity. Up to now, however, a GaN layer with a high carrier concentration still maintaining single-crystallinity has not been successfully obtained. For example, an n-type single crystalline GaN layer having an electron concentration of about $1 \times 10^{19}$ cm$^{-3}$ and a p-type single crystalline GaN layer having a hole concentration of about $1 \times 10^{18}$ cm$^{-3}$ are only currently available. In order to sufficiently diffuse a current in the semiconductor layer, it is preferred that a resistivity of the electrode layer is $1 \times 10^{-2}$ Ωcm or lower. Therefore, if the light-emitting device is fabricated using the single crystalline GaN layer, a light-emitting region is limited. As a result, light with a high intensity cannot be obtained.

On the other hand, a non-single crystalline GaN layer has a low resistivity. Moreover, it is possible to increase a hole concentration or an electron concentration to $5 \times 10^{19}$ cm$^{-3}$ or higher in the non-single crystalline GaN layer. A resistivity of the non-single crystalline GaN layer can be lowered to $1 \times 10^{-2}$ Ωcm or even lower. Up to now, a film having a resistivity of $1 \times 10^{-5}$ Ωcm has been obtained. With the GaN layer having such a low resistivity, it is possible to ensure sufficient diffusion of a current so that the GaN layer can function as an electrode layer. Thus, by using the non-single crystalline GaN electrode layer for a light-emitting device, a light-emitting region can be increased, thereby obtaining light with a high intensity. Furthermore, since the non-single crystalline GaN layer has an excellent Ohmic contact with the III–V nitride compound semiconductor layer constituting the device structure as compared with a conventional metal electrode, it is possible to lower an operational voltage.

In order to grow the non-single crystalline GaN electrode layer, a growth method commonly used to grow III–V nitride compound semiconductor layers can be used. Such a method includes, for example, an evaporation, sputtering, chemical vapor deposition, metalorganic chemical vapor deposition (MOCVD), MOCVD employing electron cyclotron resonance (ECR) plasma and molecular beam epitaxy (MBE). Therefore, since the electrode layer can be grown by using the same film growth apparatus as that used for the semiconductor layers constituting the device structure, the fabrication process can be simplified as compared with a conventional method using two different growth apparatuses, one for the device structure and the other for the electrode layer. When the non-single crystalline GaN layer is grown, the layer is grown at a lower temperature than that for the III–V nitride compound semiconductor layer. For example, the electrode layer is grown at a lower substrate temperature between about 350° C. and 600° C. in the case where a MOCVD method is employed, and at a lower substrate temperature between about 150° C. and 450° C. in the case where a MOCVD method utilizing ECR plasma is employed. As a result, a non-single crystalline GaN layer as the electrode layer is obtained.

Furthermore, it is possible to increase a carrier concentration by doping the non-single crystalline GaN layer with an impurity. For example, in the case where an n-type GaN layer is intended to be obtained, a Group IV element such as silicon, germanium, tin and titanium, or a Group VI element such as oxygen, sulfur and selenium, may be used. In the case where a p-type GaN layer is intended to be obtained, a Group II element such as magnesium and beryllium may be used.

The III–V nitride compound semiconductor layer may be used as one or more layers constituting a device structure, for example, a light-emitting device such as a light-emitting diode and a laser diode and an electronic device such as a field effect transistor. In the case where the III–V nitride compound semiconductor layer is used for the light-emitting device, a light-emitting region is constituted by utilizing a pn junction such as that of a doublehetero (DH) structure. A blue-light-emitting device having a wavelength in the range of about 400 nm to 500 nm can be fabricated by using a material containing at least Ga as a Group III element and N as a Group V element, for example, AlGaN, InGaN and AlGaInN. A composition ratio of a mixed crystal material of the semiconductor layer can be appropriately varied.

Although the polycrystalline GaN electrode layer is formed so as to be in contact with the III–V nitride compound semiconductor layer in Examples 1 to 3 described above, a non-single crystalline GaN electrode layer may be formed instead. In this case, the single crystalline structure is disrupted to obtain a non-single crystalline GaN. As a result, a high carrier concentration or a low resistivity can be obtained.

As described above, according to the present invention, since a non-single crystalline GaN electrode layer is formed as an electrode in contact with a III–V nitride compound semiconductor layer, an adherence to the semiconductor layer and a physical strength thereof can be improved. Therefore, problems such as peeling-off of the electrode, which conventionally occur, do not occur during a fabrication process. As a result, the fabrication yield and the reliability of a semiconductor device can be improved.

Moreover, since the non-single crystalline GaN electrode layer has a good Ohmic contact with the III–V nitride compound semiconductor layer, an operational voltage of the semiconductor device can be lowered.

Since GaN constituting such an electrode layer is not single crystalline, it is possible to increase a carrier concentration while attaining a low electrical resistivity. Therefore, it is possible to ensure sufficient diffusion of a current so that the layer serves as an electrode. For example, a hole concentration or an electron concentration of $5 \times 10^{19}$ cm$^{-3}$ or more can be obtained with non-single crystalline GaN.

Two or more layers containing at least Ga as a Group III element and N as a Group V element may be deposited as the III–V nitride compound semiconductor layers, thereby constituting a blue-light-emitting device. In this case, a transmittance with respect to light emitted from a layered structure, having a wavelength in the range of, for example, about 400 nm to 500 nm, can be increased to 80% or more.

Furthermore, in the case where an electrode layer made of GaN is grown, it is possible to easily grow the GaN electrode layer at a temperature lower than that for the growth of the III–V nitride compound semiconductor layer by using an apparatus commonly used for growing a III–V nitride compound semiconductor layer, such as a metalorganic chemical vapor deposition (MOCVD) apparatus. For example, the electrode layer is formed at a lower substrate temperature between about 350° C. and 600° C. in the case where a MOCVD method is employed, and at a substrate temperature between about 150° C. and 450° C. in the case where a MOCVD method utilizing an ECR plasma is employed. As a result, a non-single crystalline GaN layer as the electrode layer can be obtained.

Furthermore, since a non-single crystalline GaN electrode layer has a high transmittance with respect to light emitted from a layered structure, it is possible to improve the light output efficiency.

In addition, since the non-single crystalline GaN electrode layer can be fabricated by the same growth apparatus as that used for the III–V nitride compound semiconductor layers constituting the device structure, it is possible to successively form the III–V nitride compound semiconductor layers and the non-single crystalline GaN electrode layer. Consequently, the fabrication process can be simplified.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A III–V nitride compound semiconductor device comprising:

at least one III–V nitride compound semiconductor layer; and an electrode layer made of non-single crystalline GaN in contact with the III–V nitride compound semiconductor-layer.

2. A III–V nitride compound semiconductor device according to claim 1, wherein the electrode layer comprises a hole concentration or an electron concentration of $5\times10^{19}$cm-3 or higher.

3. A III–V nitride compound semiconductor device according to claim 1, wherein the III–V nitride compound semiconductor layer comprises a layered structure including two or more layers each containing at least Ga as a Group III element and N as a Group V element.

4. A III–V nitride compound semiconductor device according to claim 3, wherein the electrode layer has a transmittance of 80% or more with respect to a wavelength region of light emitted from the layered structure.

* * * * *